United States Patent
Murakami et al.

(10) Patent No.: US 7,995,636 B2
(45) Date of Patent: Aug. 9, 2011

(54) SEMICONDUCTOR LASER APPARATUS AND MANUFACTURING METHOD THEREOF

(75) Inventors: Akemi Murakami, Ebina (JP); Hideo Nakayama, Ebina (JP); Yasuaki Kuwata, Ebina (JP); Teiichi Suzuki, Ebina (JP); Ryoji Ishii, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 307 days.

(21) Appl. No.: 10/990,373

(22) Filed: Nov. 18, 2004

(65) Prior Publication Data

US 2005/0271107 A1    Dec. 8, 2005

(30) Foreign Application Priority Data

Jun. 8, 2004    (JP) ................... 2004-169673

(51) Int. Cl.
*H01S 5/00* (2006.01)
(52) U.S. Cl. ........... 372/50.124; 372/50.1; 372/38.02; 372/38.09; 438/91; 438/237; 438/380; 438/979; 438/983
(58) Field of Classification Search ........... 372/50, 372/50.124, 50.01, 38.02; 438/91, 237, 380, 438/979, 983
See application file for complete search history.

(56) References Cited

U.S. PATENT DOCUMENTS

| | | | | |
|---|---|---|---|---|
| 5,115,441 A * | 5/1992 | Kopf et al. | ............... | 372/45.01 |
| 5,990,499 A * | 11/1999 | Kuhlmann et al. | ............... | 257/99 |
| 6,054,716 A * | 4/2000 | Sonobe et al. | ............... | 250/552 |
| 6,185,240 B1 * | 2/2001 | Jiang et al. | ............... | 372/50.124 |
| 6,407,413 B1 * | 6/2002 | Kawamoto | ............... | 257/133 |
| 6,468,821 B2 * | 10/2002 | Maeda et al. | ............... | 438/29 |
| 6,593,597 B2 * | 7/2003 | Sheu | ............... | 257/94 |
| 6,696,704 B1 * | 2/2004 | Maeda et al. | ............... | 257/98 |
| 6,936,855 B1 * | 8/2005 | Harrah | ............... | 257/88 |
| 6,989,572 B2 * | 1/2006 | Stefanov et al. | ............... | 257/355 |
| 7,227,190 B2 * | 6/2007 | Yasukawa et al. | ............... | 257/79 |
| 7,408,967 B2 * | 8/2008 | Collins et al. | ............... | 372/46.01 |
| 7,440,865 B1 * | 10/2008 | Hofmeister et al. | ............... | 702/120 |
| 7,483,464 B2 * | 1/2009 | Kuwata et al. | ............... | 372/50.1 |
| 7,496,123 B2 * | 2/2009 | Ueki et al. | ............... | 372/38.05 |

(Continued)

FOREIGN PATENT DOCUMENTS

JP    53-102383    1/1977

(Continued)

OTHER PUBLICATIONS

WO 01/22495 translation, pp. 1-10.*

(Continued)

*Primary Examiner* — Tod T Van Roy
*Assistant Examiner* — Delma R Forde
(74) *Attorney, Agent, or Firm* — Morgan, Lewis & Bockius LLP

(57) ABSTRACT

A semiconductor laser apparatus has a Zener diode containing a first semiconductor region of a first conduction type and a second semiconductor region of a second conduction type joined with the first semiconductor region, and a vertical-cavity surface-emitting semiconductor laser diode stacked above the Zener diode and containing at least a first mirror layer of a first conduction type, a second mirror layer of a second conduction type and an active region sandwiched between the first and second mirror layers. The first semiconductor region and the second mirror layer are electrically connected and the second semiconductor region and the first mirror layer are electrically connected.

17 Claims, 7 Drawing Sheets

U.S. PATENT DOCUMENTS

| | | | |
|---|---|---|---|
| 7,508,047 B2 * | 3/2009 | Tatum et al. | 257/462 |
| 2003/0098460 A1 * | 5/2003 | Yasukawa et al. | 257/99 |
| 2003/0189201 A1 * | 10/2003 | Chen | 257/13 |
| 2003/0214233 A1 * | 11/2003 | Takahashi et al. | 313/512 |
| 2005/0247950 A1 * | 11/2005 | Nakamura et al. | 257/98 |
| 2006/0049411 A1 * | 3/2006 | Nakamura et al. | 257/79 |

FOREIGN PATENT DOCUMENTS

| | | | |
|---|---|---|---|
| JP | 59-178784 | | 10/1984 |
| JP | 11-112026 | | 4/1999 |
| JP | 11-507182 | | 6/1999 |
| JP | 11-298041 | | 10/1999 |
| JP | 2003-110152 | | 4/2003 |
| JP | 2004-128524 | | 4/2004 |
| JP | 2005311089 | * | 4/2004 |
| JP | 2005353647 | * | 12/2005 |
| WO | WO 0122495 A | * | 3/2001 |

OTHER PUBLICATIONS

Bobby M. Hawkings, et al. "Reliability of Various Size Oxide Aperture VCSELs." *Honeywell International*, 2000.

* cited by examiner

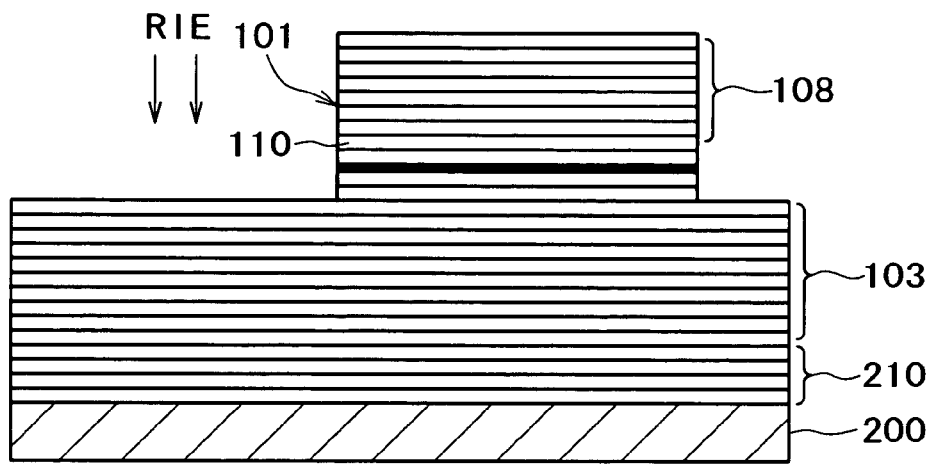
F I G. 6 A
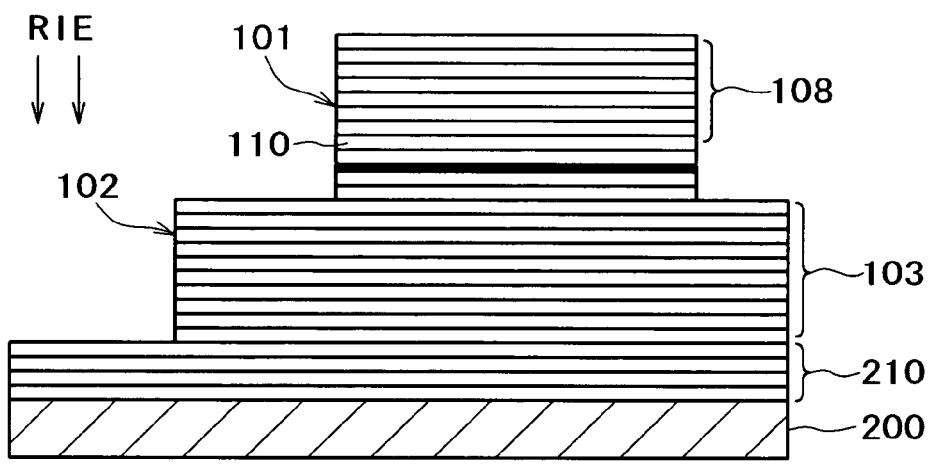
F I G. 6 B
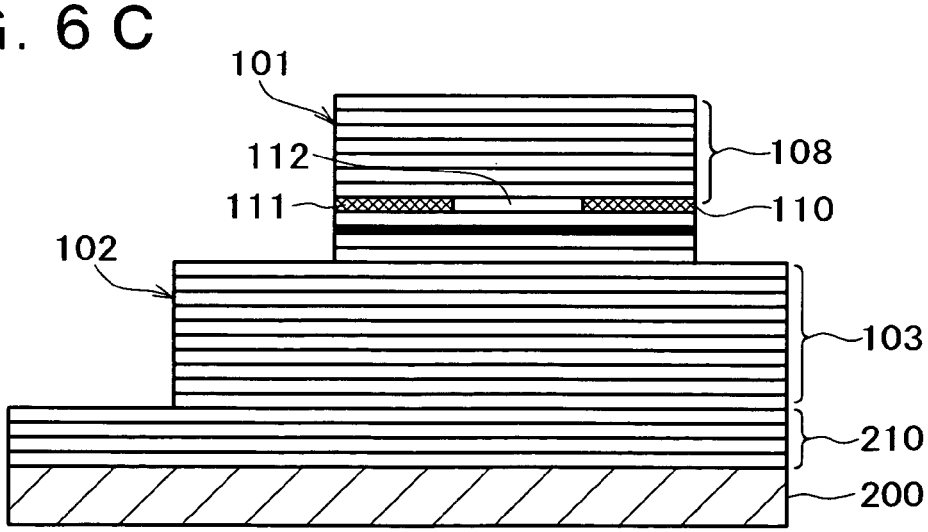
F I G. 6 C

SEMICONDUCTOR LASER APPARATUS AND MANUFACTURING METHOD THEREOF

BACKGROUND OF THE INVENTION

1. Field of the Invention

The present invention concerns a vertical-cavity surface-emitting laser diode (hereinafter referred to as VCSEL) and, it specifically relates to a protective structure for protecting the VCSEL against electrostatic damage.

2. Description of the Related Art

The VCSEL has excellent features in that it has low threshold current, small power consumption and can obtain a circular light spot easily, and light sources can be arranged as a two-dimensional array, and has been expected for use as a light source in optical communication equipment or electronic equipment.

Like other semiconductor apparatuses, the VCSEL is sometimes exposed to a high voltage by static electricity curing handling of circuit substrates, etc. If electrostatic discharge (hereinafter referred to as ESD) should occur inside the device, since a large spike current flows instantaneously, this destroys or deteriorates the device causing a failure of not being capable of conducting normal operation. Several reports have been made for coping with such problems.

In Japanese Published Unexamined Patent Application No. 11-112026, a protective device is provided separately from a light emitting device considering that the withstand voltage is as low as 50 V in the reverse direction and 150 V in the forward direction in semiconductor light emitting devices, particularly, gallium nitride compound semiconductors. As the protective device, a Zener diode or a transistor is used, for example, thereby short-circuiting the reverse voltage or a forward voltage higher than the working voltage possibly applied to the light emitting device.

In U.S. Pat. No. 6,185,240B1, a diode as a countermeasure for ESD and the VCSEL are integrated to form both of them on one identical chip. A trench is formed on the substrate to define a diode region. The diode is, preferably, a p-i-n diode having a breakdown voltage of from 10 to 20 V.

The Japanese Published Unexamined Patent Application No. 2003-110152 concerns an optical semiconductor apparatus with an improved electrostatic withstanding voltage for a light emitting device in which current flows to a light emitting device when a forward voltage is applied and current flows not only to the light emitting device but also to a semiconductor substrate when an over voltage is applied in the forward direction and current flows to the semiconductor substrate when a reverse voltage is applied to prevent damage to the light emitting device, without using a Zener diode but determining a predetermined value in the relation between the resistance of the semiconductor substrate and the light emitting device.

Further, Bobby M. Hawkings, et al. Reliability of Various Size Oxide Aperture VCSELs, Honeywell, 2000 is a study report on the reliability of a selective oxidation type VCSEL and describes a relation between the breakdown voltage due to ESD and oxidized aperture. In this report, ESD damage is tested by a human body model according to US MIL standards, and an oxidized aperture size of from 5 to 20 µm is used as a sample. When a pulse voltage in the forward direction or the reverse direction is applied to VCSEL and the optical output changes by −2 dB, it is defined as damage or failure. FIG. 9 of the Bobby M. Hawkings, et al. Reliability of Various Size Oxide Aperture VCSELs, Honeywell, 2000 shows the result of the ESD damage test. According to the result, it is considered that ESD damage is a function of an oxidized aperture diameter or area and the ESD breakdown voltage increases as the oxidized aperture diameter increases.

However, the existent protective device for the VCSEL has the following problems. Since the protective device is disposed separately from the light emitting device in Japanese Published Unexamined Patent Application No. 11-112026, in a case of handling the light emitting device as a single component, the ESD countermeasure is still insufficient. Further, this increases the number of device constituting the laser apparatus to increase the cost.

Integration of VCSEL and the protective diode on one chip in U.S. Pat. No. 6,185,240B1 is desirable as a countermeasure for ESD during handling but plural trenches have to be formed when the protective diode is formed on the substrate, which complicates the steps and cannot always form the diode easily. Further, in the Japanese Published Unexamined Patent Application No. 2003-110152, the resistance of the semiconductor substrate has to be controlled to a specified value in relation with the light emission device, and the step is not always easy.

Further, while Bobby M. Hawkings, et al. Reliability of Various Size Oxide Aperture VCSELs, Honeywell, 2000 shows that the ESD withstand voltage increases in proportion with the oxidized aperture diameter, a desired basic laser characteristics cannot be obtained by merely increasing the oxidized aperture diameter. Particularly, in a single mode VCSEL, the oxidized aperture diameter is tended to be decreased, which inevitably lowers ESD withstand voltage.

SUMMARY OF THE INVENTION

The present invention intends to address the problems in the related art, improve the resistance to static voltage break down by integrating a vertical-cavity surface-emitting laser diode and a protective device and provide a semiconductor laser apparatus of high reliability and a manufacturing method thereof.

A semiconductor laser apparatus according to an embodiment of the present invention has a Zener diode containing a first-conduction-type first semiconductor region and a second-conduction-type second semiconductor region joined with the first semiconductor region, and a vertical-cavity surface-emitting semiconductor laser diode stacked above the Zener diode and containing at least one first-conduction-type first mirror, a second-conduction-type second mirror layer and an active region sandwiched between the first and second mirror layers, wherein the first semiconductor region and the second mirror layer are electrically connected and the second semiconductor region and the first mirror layer are electrically connected.

BRIEF DESCRIPTION OF THE DRAWINGS

Embodiments of the present invention will be described in detail based on the drawings, wherein:

FIG. 6A to FIG. 6C are cross sectional views showing the steps of manufacturing the semiconductor laser apparatus according to a first embodiment;

DETAILED DESCRIPTION OF THE INVENTION

The present invention is to be described by way of embodiments with reference to the drawings. In a semiconductor laser apparatus according to the invention, a selectively oxidized type VCSEL and a Zener diode are stacked above a substrate.

Figure 1A:
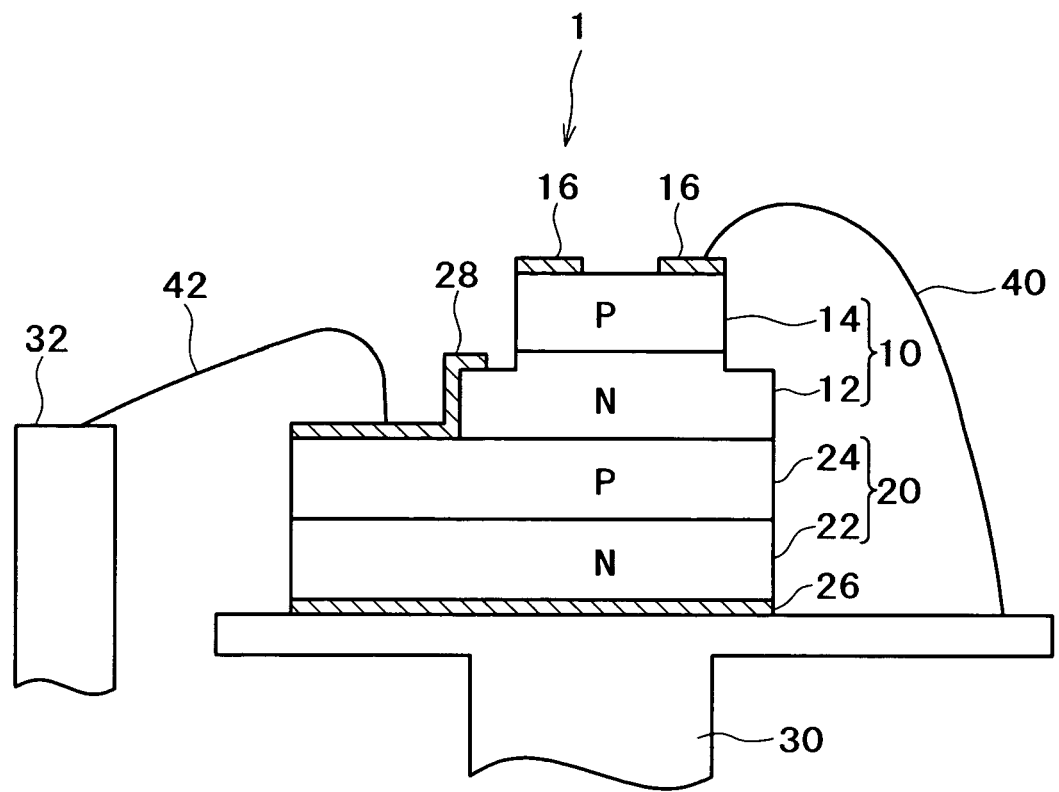
FIG. 1A is a view showing a schematic structure of a semiconductor laser apparatus according to an embodiment of the present invention.
Figure 1B:
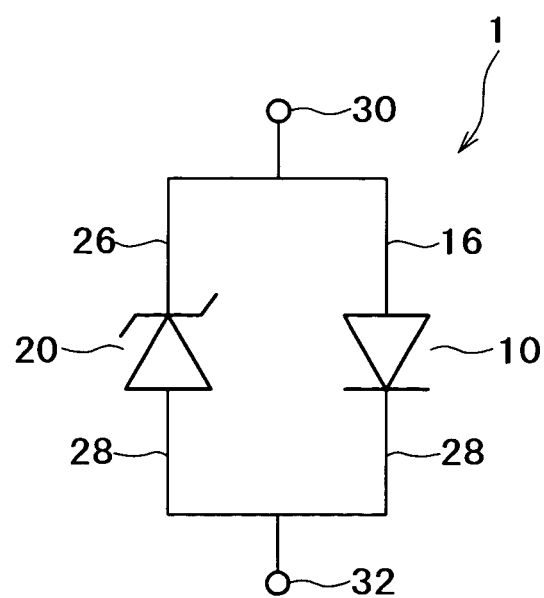
FIG. 1B is an equivalent circuit diagram thereof.

FIG. 1A is a view showing a schematic configuration of a semiconductor laser apparatus of this embodiment and FIG. 1B is an equivalent circuit diagram of the semiconductor laser apparatus of this embodiment. As shown in FIG. 1A, a semiconductor laser apparatus 1 has a VCSEL 10 emitting a laser beam and a Zener diode 20 protecting a VCSEL 10 against a high voltage of static electricity, and the like. The Zener diode 20 has an n-type semiconductor layer 22 and a p-type semiconductor layer 24 joined therewith. The n-type semiconductor layer 22 may be, for example, an n-type semiconductor substrate of GaAs and the like, or a semiconductor substrate having an n-type semiconductor layer stacked thereon. The p-type semiconductor layer 24 is, for example, an epitaxial layer such as of GaAs.

The VCSEL 10 is fabricated into a circular cylindrical or square cylindrical post or in a mesa-form and stacked above the Zener diode 20. The VCSEL 10 contains an n-type lower mirror layer 12 and a p-type upper mirror layer 14. An active region and the like are interposed between the mirror layers, and details of them will be described later.

An n-side electrode layer 26 is formed at the back surface of the semiconductor layer 22 of the Zener diode 20, and is electrically connected with a first metal lead 30. Further, a p-side electrode layer 16 is electrically connected on the upper mirror layer 14 of the VCSEL 10 and is connected by way of a bonding wire 40 to the first metal lead 30. This makes the n-side electrode layer 26 and the p-side electrode layer 16 to an equi-potential. The p-type semiconductor layer 24 of the Zener diode and the lower mirror layer 12 of the VCSEL 10 are electrically connected by an electrode layer 28. The electrode layer 28 is further connected by way of a bonding wire 42 to a second metal lead 32.

With the configuration described above, the VCSEL 10 is connected in parallel with the Zener diode 20 with the polarity being reversely as shown in FIG. 1. The anode (p-side electrode layer 16) of the VCSEL 10 is connected with the cathode (n-side electrode layer 26) of the Zener diode 20, and the cathode of the VCSEL 10 is connected with the anode of the Zener diode 20 by an electrode layer 28.

The first metal lead 30 is connected with the anode (n-side electrode layer 16) and the second metal lead 32 is connected with the cathode (electrode layer 28) of the VCSEL 10. When the VCSEL 10 is driven, a voltage at about 2 V is applied in the forward direction between the first and the second metal leads 30, 32 and a laser beam at a predetermined wavelength is emitted from the VCSEL 10. The Zener diode 20 flows a current from the first metal lead 30 to the second metal lead 32 when a Zener voltage (breakdown voltage), preferably at 3 V or higher, is applied.

On the other hand, when a voltage in the reverse direction is applied to the VCSEL 10, the Zener diode 20 operates by the forward voltage like usual diode and supplies current from the second metal lead 32 to the first metal lead 30. Thus, the breakdown voltage of the VCSEL 10 can be increased substantially to protect the VCSEL 10 against high voltage such as caused by static electricity.

Figure 2:
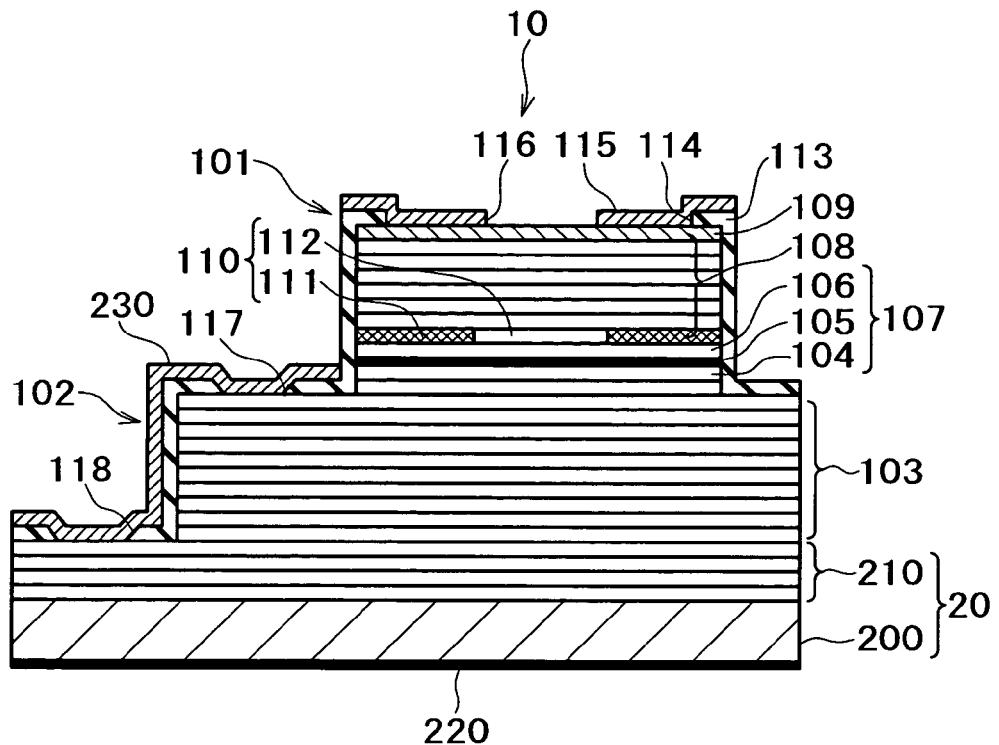
FIG. 2 is a cross sectional view showing the configuration of a semiconductor laser apparatus according to a first embodiment of the invention.

FIG. 2 is a cross sectional view showing a configuration of a semiconductor laser apparatus according to the first embodiment. A Zener diode contains an n-type GaAs substrate 200 and a p-type GaAs layer 210 stacked therewith. An n-side electrode layer 220 is formed at the back surface of the n-type GaAs substrate 200. For the electrode layer 220, a stack of Ti and Au can be used for instance.

The VCSEL 10 has a first post 101 having a first diameter and a second post 102 having a second diameter larger than the first diameter of the first post. The second post is stacked above the Zener diode 20 and the first post is stacked above the second post.

"Diameter" used in this specification is defined as described below. The diameter, in a case where the post is a circular cylindrical shape, is a diameter of a cross section parallel with the substrate 200, while the diameter in a case where the post is a square cylindrical shape is an diagonal distance of a cross section parallel with the substrate 200. The diameter in another shape is defined, in view of the shape of a cross section parallel with the substrate 200 of the post, as the maximum value of the distances when plural portions are connected by straight lines, or an average distance thereof.

On a p-type GaAs substrate 210 are stacked an n-type lower DBR (Distributed Bragg Reflector) mirror layer 103, an active region 107 containing an undoped lower spacer layer 104, an undoped quantum well active layer 105, and an undoped upper spacer layer 106, as well as a p-type DBR mirror layer 108 successively. A p-type contact layer 109 is formed to the uppermost layer of the upper DBR layer 108, and a p-type AlAs layer 110 is formed to the lowermost layer thereof.

The first post 101 extends as far as a portion of the lower DBR mirror layer 103, further, the end of the lower DBR mirror layer 103 is etched and the second post 102 is formed so as to protrude the end of the Zener diode 20. The shape for the first and second posts 101, 102 is not particularly limited and, for example, may be a circular cylindrical shape or a square cylindrical shape.

The AlAs layer 110 has an oxidized region 111 oxidized partially from the lateral side of the post 101 and a conductive aperture 112 surrounded by the oxidized region 111. The AlAs layer 110 conducts optical confinement and current confinement by the oxidized region 111 and acts as a so-called current confining layer.

The lateral side and the upper surface of the first post 101 are covered with an interlayer insulative film 113. A contact hole 114 for exposing the surface of the contact layer 109 is formed in the interlayer insulative film 113. A p-side electrode 115 is formed on the interlayer insulative film 113, and the p-side electrode layer 115 is in ohmic contact with the contact layer 109 by way of the contact hole 114. A laser emitting window 116 is formed at the center of the p-side electrode layer 115 for emitting a laser beam.

A contact hole 117 for exposing the lower DBR mirror layer 103 is formed in the interlayer insulative film 113 that covers the bottom of the first post. Further, the interlayer insulative film 113 extends from the lateral side to the bottom of the second post 102 and covers the p-type GaAs layer 210 of the Zener diode 20. A contact hole 118 is formed at the bottom thereof for exposing the GaAs layer 210. A metal layer 230 is formed from the bottom of the first post 101 to the bottom of the second post 102, and the metal layer 230 electrically connects the n-type lower DBR mirror layer 103 and the p-type GaAs layer 210 in the contact holes 117 and 118, respectively.

As shown in FIG. 1A, the n-side electrode layer 220 of the Zener diode 20 is electrically connected with the first metal layer 30, and further, the p-side electrode layer 115 is connected with the first metal lead 30 by way of the wire bonding 40 or the like. Further, the metal layer 230 is connected with the second metal lead 32 by way of the wire bonding 32 or the like.

In a case where a forward voltage is applied between the first and second metal leads 30 and 32, when the voltage is lower than the Zener voltage of the Zener diode 20, the VCSEL 10 is driven to emit a laser beam from the emission window 116. The Zener voltage of the Zener diode can be, preferably, 3 V or higher. The breakdown voltage in the forward direction of the VCSEL 10 is several hundreds of volts, and when a voltage higher than the Zener voltage is applied between the first and second meal leads 30, 32, a portion of the current is shunted by way of the Zener diode 20.

When a reverse voltage is applied between the first and second metal leads 30, 32, since the forward voltage of the Zener diode 20 is about 0.7 V and the reverse breakdown voltage of the VCSEL 10 is several tens of volts, the applied current is shunted by way of the Zener diode 20, and the VCSEL 10 is protected.

Figure 3:
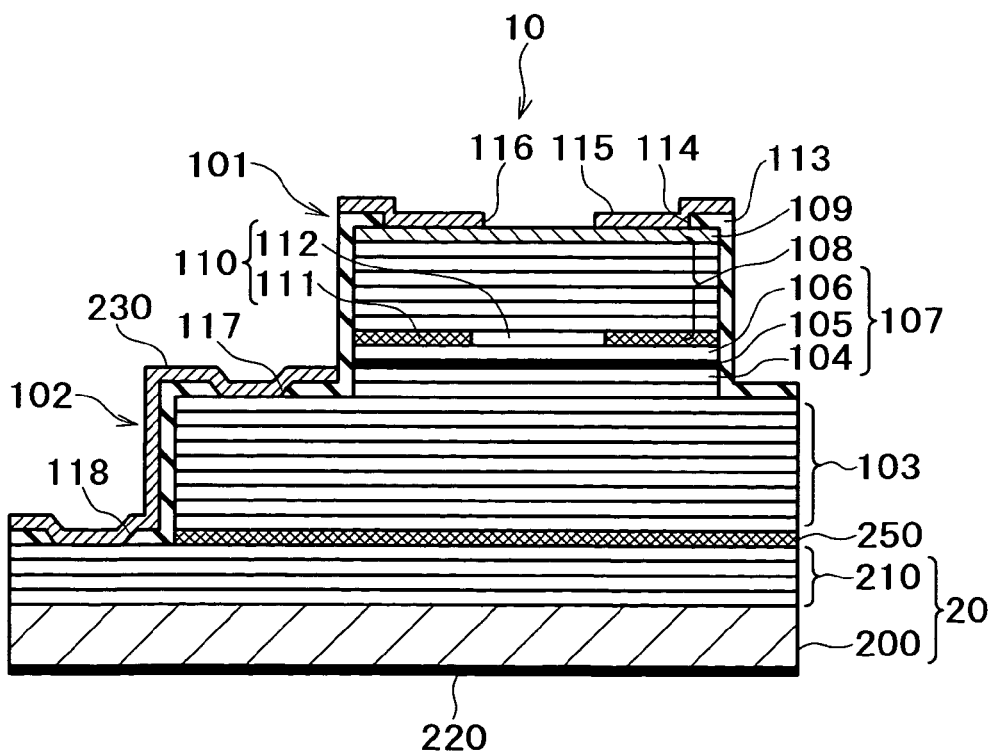
FIG. 3 is a cross sectional view showing the configuration of a semiconductor laser apparatus according to a second embodiment of the invention.

Then, FIG. 3 shows a cross sectional view for a semiconductor laser apparatus according to the second embodiment. In the laser apparatus according to the second embodiment, an oxide film 250 is interposed between the Zener diode 20 and the VCSEL 10, and this is different distinctly from the configuration of the first embodiment.

The oxide film 250 may be formed simultaneously with the formation of the current confining layer 110 of the VCSEL 10 by oxidation. In this case, since the oxidized distance of the oxide film 250 is larger than the oxidized distance of the selectively oxidized region 111 of the current confining layer 110 in the first post 101, it is necessary to make the oxidization rate of the oxide film 250 higher than that for the selectively oxidized region 111.

In a case where the oxide film 250 includes $Al_xGa_{1-x}As$ and the current confining layer 110 includes $Al_yGa_{1-y}As$, X may be larger than Y. (X and Y represent an aluminum (Al) contents ratio to gallium (Ga) of the oxide film 250 and the current confining layer 110, respectively.) This is because the oxidization rate decreases as the Ga content ratio is higher. The oxide film 250 may also be AlAs. The ratio of X to Y is properly selected in accordance with the diameter of the first post 101 and the size of the conductive aperture 112 in the current confining layer 110.

In addition, the film thickness of the oxide film 250 and the current confining layer 110 may also be set to an appropriate ratio. That is, since the oxidization rate increases as the film thickness is larger, the thickness of the oxide film 250 may be properly selected in accordance with the size of the conductive aperture 112.

Further, it is not always restricted that oxidation for the oxide film 250 is always conducted by the step identical with that for the oxidation of the current confining layer 110 and each of them may be formed by individual oxidation steps. Further, the substance interposed between the VCSEL 10 and the Zener diode 20 is not restricted to the oxide film, and another insulative film or high resistance film may also be used.

According to the second embodiment, since the VCSEL 10 and the Zener diode 20 are electrically insulated from each other, it is possible to completely prevent the thyristor operation due to the PNPN structure caused by the leak current from the VCSEL 10 or the Zener diode 20.

FIG. 4 is a view showing other configuration examples of Zener diodes. In the Zener diode shown in FIG. 4A, plural n-type AlGaAs layers 310, for example, are stacked above an n-type GaAs substrate 300, and p-type AlGaAs layers 320 are stacked further thereon. An n-side electrode 330 is formed at the back surface of the n-type substrate 300. The VCSEL 10 is stacked above the p-type AlGaAs layers 320 of the Zener diode. This can simply form the Zener diode and the VCSEL by epitaxial growing for once. The semiconductor layer is not limited to the AlGaAs layer and a semiconductor layer of another material may also be stacked.

Figure 4A:
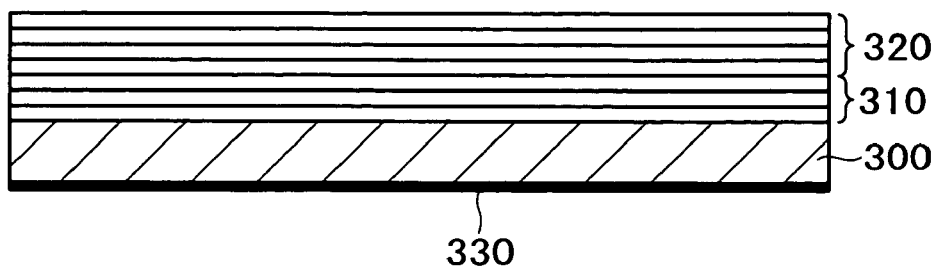
FIG. 4A to FIG. 4D are cross sectional views showing configurational example of Zener diodes.
Figure 4B:
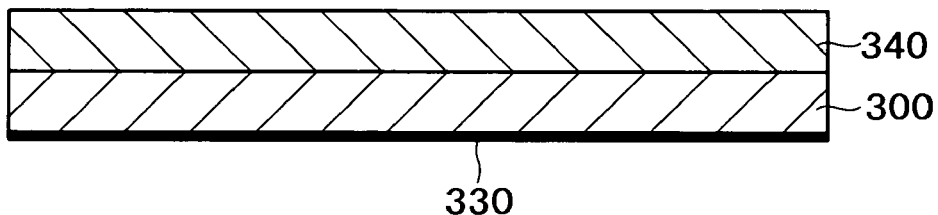
Figure 4C:
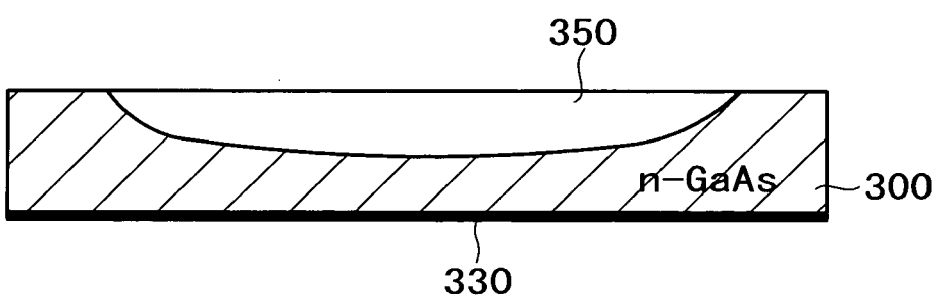
Figure 4D:
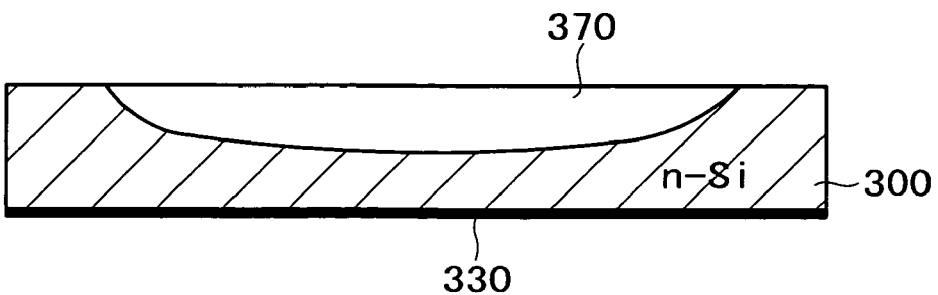

Further, as shown in FIG. 4B, it may be a configuration in which a p-type GaAs substrate 340 is joined on an n-type GaAs substrate 300. Further, as shown in FIG. 4C, the Zener diode may be of a configuration in which impurities such as Zn or Be are diffused in an n-type GaAs substrate 300 to form a $p^+$-diffusion region 350 in the substrate 300. Further, as shown in FIG. 4D, it may be of a configuration in which impurities such as B or In are diffused in an n-type silicon substrate 360 to form a $p^+$-diffusion region 370 in the substrate 360. In this case, the VCSEL 10 can be bonded above the Zener diode by use of adhesive or the like. In addition to diffusion, p-type region may also be formed by ion implanting impurities.

Figure 5A:
FIG. 5A to FIG. 5C are cross sectional views showing the steps of manufacturing a semiconductor laser apparatus according to the first embodiment.
Figure 5B:
Figure 5C:
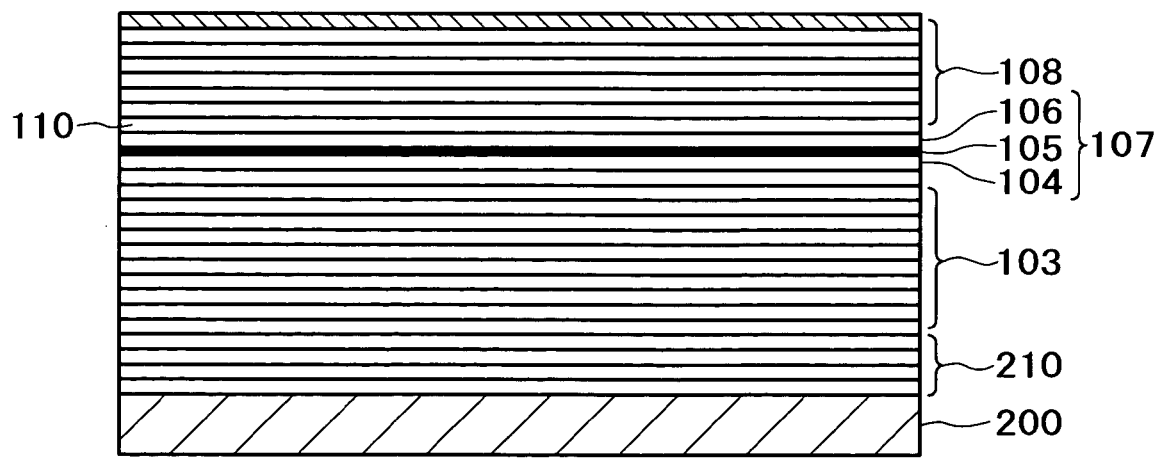

Then, a method of manufacturing a semiconductor laser apparatus according to the first embodiment is to be described with reference to the cross sectional views for the steps shown in FIG. 5 to FIG. 8. As shown in FIG. 5A, the n-type GaAs substrate 200 is provided. Then, as shown in FIG. 5B, the p-type GaAs layer 210 is stacked above the n-type GaAs substrate 200 by use of a metal oxide chemical vapor deposition (MOCVD) method. Then, as shown in FIG. 5C, the n-type lower DBR mirror layer 103, the active region 107 containing the undoped lower spacer layer 104, the undoped quantum well active layer 105 and the undoped upper spacer layer 106, and the p-type upper DBR mirror layer 108 containing the contact layer 109 and the AlAs layer (current confining layer) 110 are stacked successively. A buffer layer may also be added in the lower DBR mirror layer 103.

The lower DBR mirror layer 103 is a multi-layered stack including an n-type $Al_{0.9}Ga_{0.1}As$ layer and an n-type $Al_{0.3}Ga_{0.7}As$ layer with the thickness of each layer being $\lambda/4n_r$ (in which $\lambda$ represents an wavelength of light emitted from the quantum well active layer 105 and $n_r$ represents a refractive index of a medium), and the layers are stacked alternately at a period of 40.5. The carrier concentration after doping silicon as an n-type impurity is $3 \times 10^{18}$ cm$^{-3}$.

The lower spacer layer 104 in the active region 107 is an undoped $Al_{0.6}Ga_{0.4}As$ layer, and the quantum well active layer 105 contains an undoped $Al_{0.11}Ga_{0.89}As$ quantum well layer and an undoped $Al_{0.3}Ga_{0.7}As$ barrier layer. The upper spacer layer 106 is an undoped $Al_{0.6}Ga_{0.4}As$ layer.

The upper DBR mirror layer 108 is a stack including a p-type $Al_{0.9}Ga_{0.1}As$ layer and a p-type $Al_{0.3}Ga_{0.7}As$ layer with the thickness of each layer being $\lambda/4n_r$ (in which $\lambda$ represents an wavelength of light emitted from the quantum well active layer 105 and $n_r$ represents a refractive index of a medium) and the layers are stacked alternately at a cycle of 30. The carrier concentration after doping carbon as a p-type impurity is $3\times10^{18}$ cm$^{-3}$. The p-type contact layer 109 as the uppermost layer of the upper DBR mirror layer 108 is a GaAs layer with a thickness of 20 nm and at a carbon concentration of $1\times10^{20}$ cm$^{-3}$. Further, the p-type AlAs layer 110 is disposed to the lowermost layer of the upper DBR layer 108.

Then, a mask pattern is formed over the upper DBR mirror layer 108 by use of a photolithographic step. For the mask pattern, SiO$_2$ or resist can be used for instance. The mask pattern defines the diameter for the first post of the VCSEL. As shown in FIG. 6A, stacked semiconductor layers are etched by reactive ion etching (RIE) by use of the mask pattern to form a first post 101. The etching is applied until a portion of the lower DBR mirror layer 103 is exposed.

The mask pattern is removed and, further, a mask pattern covering the upper surface, the lateral surface and the bottom of the first post 101 is formed by use of a photolithographic step. Then, as shown in FIG. 6B, the lower DBR mirror 103 is applied with reactive etching to form the second post 102 so as to expose the surface of the p-type GaAs layer 210.

Then, as shown in FIG. 6C, the substrate 101 is exposed to a steam atmosphere at 350° C. using nitrogen as a carrier gas (flow rate: 2 liter/min.) for 30 minutes. The oxidation rate of the AlAs layer 110 of the VCSEL 10 is much higher compared with that of the Al$_{0.8}$Ga$_{0.2}$As layer and the Al$_{0.1}$Ga$_{0.9}$As layer constituting the upper layer. Thus, oxidation is started for the AlAs layer 110 from the lateral side of the post and, finally, the current confining layer having the oxidized region 111 conforming the outer profile of the post and the conductive aperture 112 surrounded with the oxidized region 111 is formed. The conductivity of the oxidized region 111 is lowered to form the current confining portion and, at the same time, also functions as an optical confining region in view of a relation that the optical refractive index is about one-half (to 1.6) compared with that of the peripheral semiconductor layer and the conductive aperture 112 forms a current injection portion.

Figure 7A:
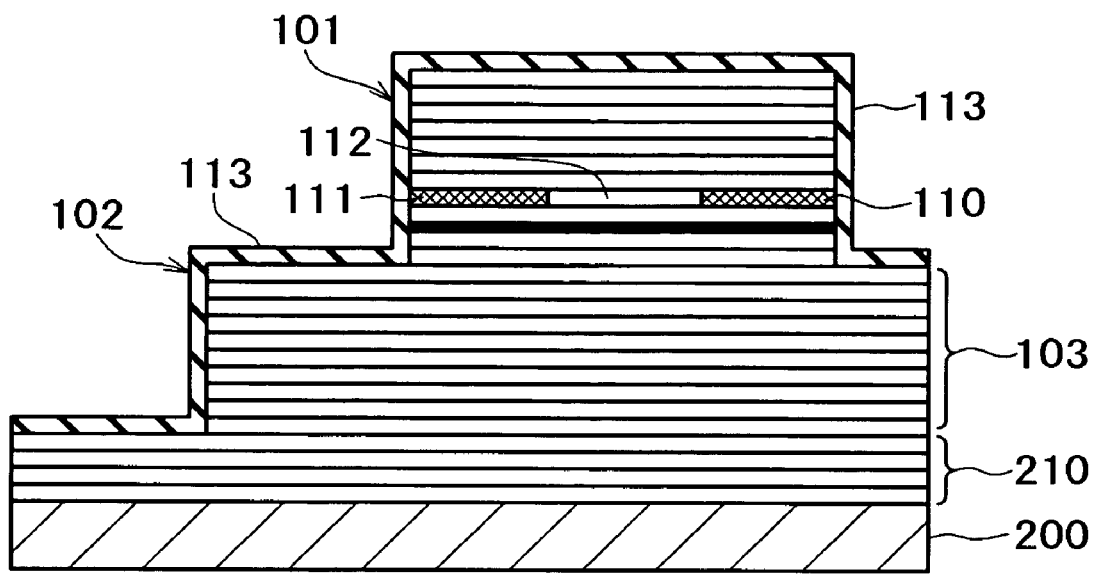
FIG. 7A and FIG. 7B are cross sectional views showing the steps of manufacturing the semiconductor laser apparatus according to the first embodiment.
Figure 7B:
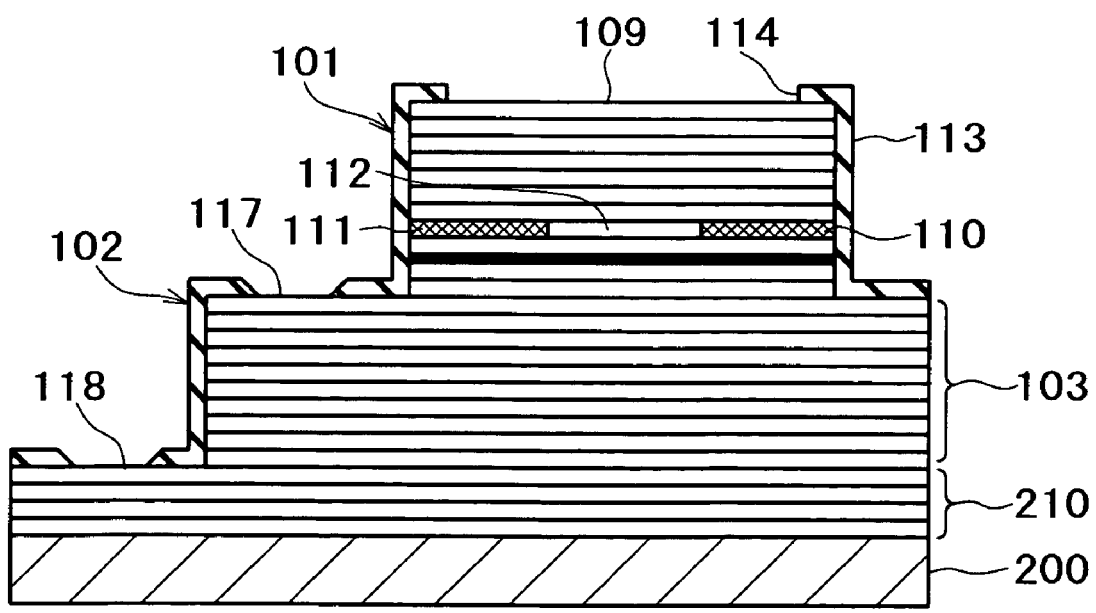

Then, as shown in FIG. 7A, an interlayer insulative film 113 is deposited for the entire surface of a substrate including the exposed first and second posts 101 and 102. Then as shown in FIG. 7B, a contact hole 114 is formed in the interlayer insulative film 113 at the top of the first post 120 to expose the contact layer 109. At the same time, the contact hole 117 is formed at the bottom of the first post 101 for exposing the lower DBR mirror layer 103, and the contact hole 118 is formed at the bottom of the second post 102 for exposing the p-type GaAs layer 210.

Then, an electrode layer is formed over the entire surface of the substrate inducing the first and second posts, the electrode layer is patterned to form the p-side electrode layer 115 and the electrode layer 230 as shown in FIG. 2. The electrode layer is, for example, a stacked film of Ti/Au. Then, the n-side electrode layer 220 made of Ti/Au and the like is formed to the back surface of the n-substrate 200.

Then, FIG. 8 show a method of manufacturing a semiconductor laser apparatus according to a second embodiment. In the second embodiment, for interposing the oxide film 250 between the Zener diode and the VCSEL, as shown in FIG. 8, an Al$_x$Ga$_{1-x}$As layer 250 (0<X<1) is formed between the p-type GaAs layer 210 and the lower DBR mirror layer 103. The conduction type of the Al$_x$Ga$_{1-x}$As layer 250 may either be a p-type or an n-type. The Al$_x$Ga$_{1-x}$As layer 250 may be a single layer or plural layers, and the film thickness can be controlled by epitaxial growing.

Further, in a case where the current confining layer 110 of the VCSEL 10 is an Al$_y$Ga$_{1-y}$As layer 110 (0<y<1), the relation with the Al$_x$Ga$_{1-x}$As layer 250 is controlled as X>Y. This is for reducing the oxidation rate of the current confining layer 110 to lower than that of the Al$_x$Ga$_{1-x}$As layer 250 as described above. In addition, the thickness of the Al$_x$Ga$_{1-x}$As layer 250 may be made larger than that of the current confining layer 110 and the ratio for the oxidation rate may be made larger.

Figure 8A:
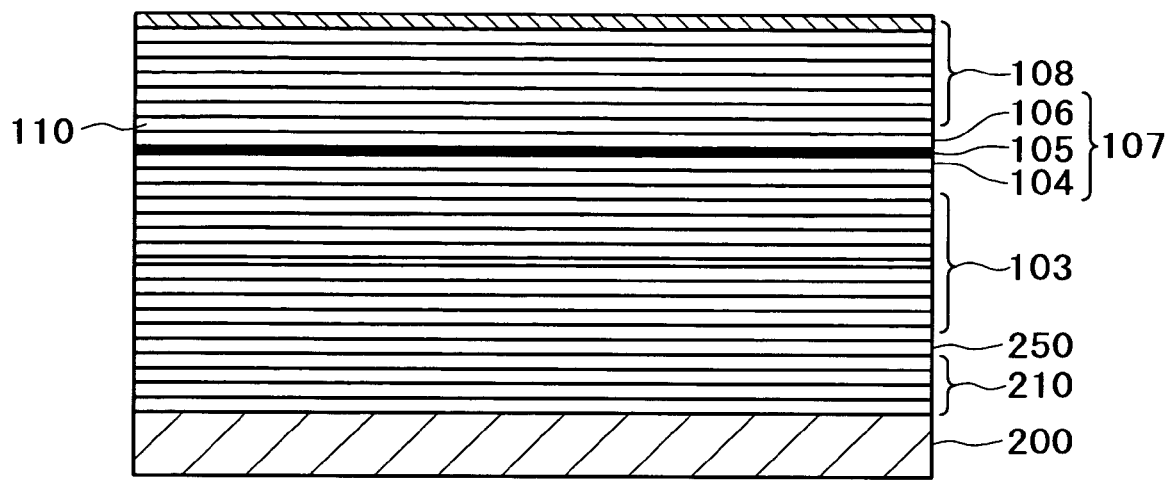
FIG. 8A and FIG. 8B are cross sectional views showing the steps of manufacturing the semiconductor laser apparatus according to the second embodiment.
Figure 8B:
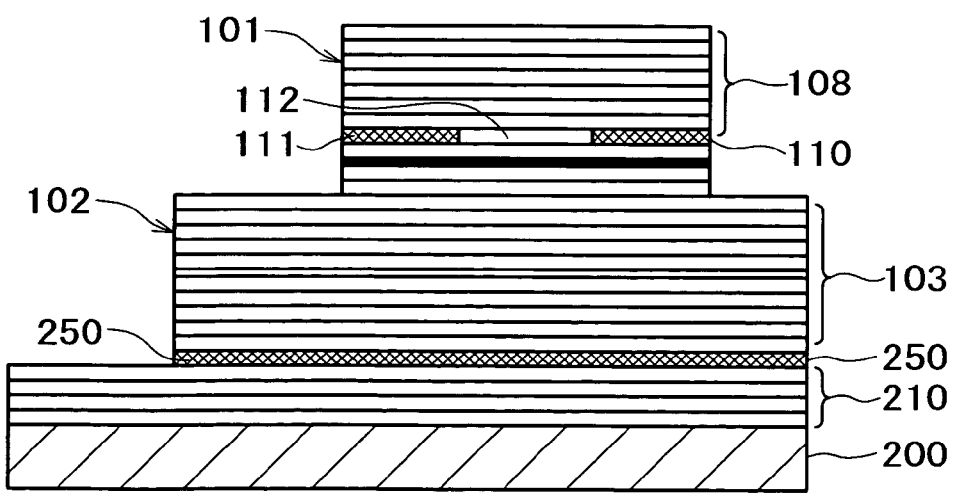

From the state shown in FIG. 8A, like the step in the first embodiment, the first post 101 and the second post 102 are formed and then, as shown in FIG. 8B, oxidizing treatment is applied. This forms the conductive aperture 112 surrounded with the selectively oxidized region 111 is formed in the current confining layer 110 of the VCSEL 10, while the Al$_x$Ga$_{1-x}$As layer 250 is entirely converted into an oxidized region. As a result, the Zener diode 20 and the VCSEL 10 are electrically insulated from each other.

As has been described above, according to the first and the second embodiments, it is possible, by integrating the VCSEL 10 and the Zener diode 20 on the substrate, to increase the breakdown voltage of the VCSEL and prevent failure of the laser apparatus by static electricity or by reverse bias voltage during handling of the laser apparatus.

Further, the post diameter and the post shape of the Zener diode or the VCSEL can be changed properly as a matter of design. Further, while a GaAs compound semiconductor laser diode is shown for the VCSEL in the embodiments described above, this may be other semiconductor laser diodes using gallium nitride or gallium indium series.

The invention has been described above specifically with reference to embodiments but the invention is not restricted to such specified embodiments and can be changed and modified variously within the scope of the gist of the invention as described in the scope for the claim of patent.

The semiconductor laser apparatus according to the embodiments of the invention can be utilized, for example, in a light source for optical communication equipment utilizing optical fibers, etc. optical communication systems using them, as well as electronic apparatus and copying machines that conduct optical reading or writing.

As described above, a semiconductor laser apparatus according to an embodiment of the present invention has a Zener diode containing a first-conduction-type first semiconductor region and a second-conduction-type second semiconductor region joined with the first semiconductor region, and a vertical-cavity surface-emitting semiconductor laser diode stacked above the Zener diode and containing at least one first-conduction-type first mirror, a second-conduction-type second mirror layer and an active region sandwiched between the first and second mirror layers, wherein the first semiconductor region and the second mirror layer are electrically connected and the second semiconductor region and the first mirror layer are electrically connected.

The first semiconductor region may contain a first-conduction-type substrate and the second semiconductor region may be an epitaxial layer formed over the substrate. In this embodiment, a first electrode layer may be formed on a back surface of the first-conduction-type substrate and electrically connected with the substrate, a second electrode layer may be formed on the second mirror layer and electrically connected with the second mirror layer, and the first and second electrode layers may be electrically connected.

Further, the first semiconductor region may contain a first-conduction-type substrate and the second semiconductor layer may be formed by diffusing or implanting impurities in the substrate. For example, in a case of a GaAs substrate, p$^+$-diffusion layer can be formed by diffusing impurities such as Zn or Be.

The Zener diode and the surface-emitting semiconductor laser may be manufactured by epitaxial growing for once by forming the second semiconductor region of the Zener diode as an epitaxial layer and forming the first mirror layer, the active region and the second mirror layer stacked thereabove as epitaxial layers, by which the steps can be simplified.

A high resistance film may be interposed between the second semiconductor region and the first mirror layer. In a case where the vertical-cavity surface-emitting semiconductor laser diode contains a selectively oxidized region at a position adjacent with the active region, the high resistance film may be an oxide film formed simultaneously with the selectively oxidized region. The vertical-cavity surface-emitting semiconductor laser diode may include a post above the Zener diode and an oxidation rate of the oxide film may be higher than that of the selectively oxidized region in the post. For example, a ratio of oxidation rate is obtained, for example, by controlling as X>Y when the oxide film includes $Al_xGa_{1-x}As$ and the selectively oxidized region includes $Al_yGa_{1-y}As$.

A Zener voltage of the Zener diode may be higher than a driving voltage of the vertical-cavity surface-emitting semiconductor laser diode. For example, the Zener voltage may be about 3 V or higher. This is because the driving voltage of the VCSEL is generally at about 2 V.

A method of manufacturing a semiconductor laser apparatus according to another embodiment of the invention may have a step of forming plural semiconductor layers including at least a first-conduction-type first semiconductor layer, a second-conduction-type second semiconductor layer joined with the first semiconductor layer, a first-conduction-type third semiconductor layer formed on the second semiconductor layer, an active region formed on the third semiconductor layer and a second-conduction-type fourth semiconductor layer formed on the active region, a step of etching a portion of the plural semiconductor layers to form a post over the second semiconductor layer, a step of selectively oxidizing a portion of a current confining layer contained in the post, and a step of electrically connecting the first semiconductor layer and the fourth semiconductor layer and electrically connecting the second semiconductor layer with the third semiconductor layer.

The first semiconductor layer may contain a first-conduction-type substrate and second to fourth semiconductor layers may be formed by epitaxial growing. Further, a high resistance layer may be formed between the second semiconductor layer and the third semiconductor layer, in which the high resistance layer may be an oxide layer formed simultaneously with formation of a selectively oxidized region of the current confining layer.

According to the semiconductor laser apparatus of an embodiment of the invention, since the VCSEL and the Zener diode (protective device) are stacked above the substrate, the steps can be simplified more compared with the existent case of forming the diode by trench processes. At the same time, since the breakdown voltage of the VCSEL can be increased, failure of the laser apparatus upon handling such as mounting can be avoided. Further, since individual mounting of the protective device is not required as in the existent case, the mounting step can be simplified.

The entire disclosure of Japanese Patent Application No. 2004-169673 filed on Jun. 8, 2004 including specification, claims, drawings and abstract is incorporated herein by reference in its entirety.

What is claimed is:

1. A semiconductor laser apparatus comprising:
    a Zener diode containing a first semiconductor region of a first conduction type and a second semiconductor region of a second conduction type joined with the first semiconductor region; the first semiconductor region containing a substrate;
    a vertical-cavity surface-emitting semiconductor laser diode stacked above the second semiconductor region of the Zener diode and containing at least a first mirror layer of a first conduction type, a second mirror layer of a second conduction type and an active region sandwiched between the first and second mirror layers;
    a first post that extends from the first mirror layer to the second mirror layer; and
    a second post that is formed beneath the first post so as to protrude an end of the Zener diode, wherein
    the first semiconductor region and the second mirror layer are electrically connected and the second semiconductor region and the first mirror layer are electrically connected.

2. The semiconductor laser apparatus according to claim 1, wherein the first semiconductor region contains a substrate of a first conduction type and the second semiconductor region is an epitaxial layer formed over the substrate.

3. The semiconductor laser apparatus according to claim 2, wherein a first electrode layer is formed on a back surface of the substrate and electrically connected with the substrate, a second electrode layer is formed on the second mirror layer and electrically connected with the second mirror layer, and the first and second electrode layers are electrically connected.

4. The semiconductor laser apparatus according to claim 1, wherein the first semiconductor region contains a substrate of a first conduction type and the second semiconductor layer is formed by diffusing or implanting impurities in the substrate.

5. The semiconductor laser apparatus according to claim 1, wherein the first mirror layer, the active region and the second mirror layer are epitaxial layers formed above the second semiconductor region.

6. The semiconductor laser apparatus according to claim 1, wherein a high resistance film is interposed between the second semiconductor region and the first mirror layer.

7. The semiconductor laser apparatus according to claim 6, wherein the vertical-cavity surface-emitting semiconductor laser diode contains a selectively oxidized region at a position adjacent with the active region, and the high resistance film is an oxide film formed simultaneously with the selectively oxidized region.

8. The semiconductor laser apparatus according to claim 7, wherein the vertical-cavity surface-emitting semiconductor laser diode contains a post above the Zener diode and an oxidation rate of the oxide film is higher than that of the selectively oxidized region in the post.

9. The semiconductor laser apparatus according to claim 8, wherein, when the oxide film comprises $Al_xGa_{1-x}As$ and the selectively oxidized region comprises $Al_yGa_{1-y}As$, X and Y satisfy the following inequality:

$$X>Y.$$

10. The semiconductor laser apparatus according to claim 1, wherein a Zener voltage of the Zener diode is higher than a driving voltage of the vertical-cavity surface-emitting semiconductor laser diode.

11. The semiconductor laser apparatus according to claim 10, wherein the Zener voltage is about 3 V or higher.

12. A method of manufacturing a semiconductor laser apparatus comprising:
    forming a plurality of semiconductor layers including at least a first semiconductor layer of a first conduction type, a second semiconductor layer of a second conduction type joined with the first semiconductor layer, a third semiconductor layer of a first conduction type formed on the second semiconductor layer, an active region formed on the third semiconductor layer and a fourth semiconductor layer of a second conduction type formed on the active region;

etching a portion of the plurality of semiconductor layers to form a post on the second semiconductor layer;

selectively oxidizing a portion of a current confining layer contained in the post; and electrically connecting the first semiconductor layer with the fourth semiconductor layer and electrically connecting the second semiconductor layer with the third semiconductor layer.

13. The method of manufacturing a semiconductor laser apparatus according to claim 12, wherein the first semiconductor layer contains a substrate of a first conduction type and the second to fourth semiconductor layers are formed by epitaxial growing.

14. The method of manufacturing a semiconductor laser apparatus according to claim 12, wherein a high resistance layer is formed between the second semiconductor layer and the third semiconductor layer.

15. The method of manufacturing a semiconductor laser apparatus according to claim 14, wherein the high resistance layer is an oxide layer formed simultaneously with formation of a selectively oxidized region of the current confining layer.

16. The method of manufacturing a semiconductor laser apparatus according to claim 15, wherein, when the oxide layer comprises $Al_xGa_{s-x}As$ and the current confining layer comprises $Al_yGa_{1-y}As$, X and Y satisfy the following inequality:

$$X > Y.$$

17. The semiconductor laser apparatus of claim 2, wherein the first post contains a selectively oxidized region at a position adjacent with the active region, which is oxidized from a lateral side of the first post, wherein the second post contains an oxide film, between the second semiconductor region and the second mirror layer, which is oxidized from a lateral side of the second post, and wherein the selectively oxidized region and the oxide film is oxidized simultaneously.

* * * * *